(12) United States Patent
Wang et al.

(10) Patent No.: US 11,768,782 B2
(45) Date of Patent: *Sep. 26, 2023

(54) DATA BUS DUTY CYCLE DISTORTION COMPENSATION

(71) Applicant: Micron Technology, Inc., Boise, ID (US)

(72) Inventors: Guan Wang, San Jose, CA (US); Ali Feiz Zarrin Ghalam, Sunnyvale, CA (US); Chin-Yu Chen, San Jose, CA (US); Jongin Kim, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/880,226

(22) Filed: Aug. 3, 2022

(65) Prior Publication Data

US 2022/0374370 A1   Nov. 24, 2022

Related U.S. Application Data

(63) Continuation of application No. 16/949,510, filed on Oct. 30, 2020, now Pat. No. 11,442,877.

(51) Int. Cl.
| | | |
|---|---|---|
| *G06F 13/16* | (2006.01) | |
| *G11C 16/32* | (2006.01) | |
| *H03K 3/017* | (2006.01) | |
| *G11C 29/02* | (2006.01) | |
| *G11C 29/12* | (2006.01) | |
| *G11C 29/16* | (2006.01) | |
| *G11C 7/22* | (2006.01) | |
| *H03K 5/156* | (2006.01) | |
| *G11C 16/04* | (2006.01) | |

(52) U.S. Cl.
CPC .......... *G06F 13/1668* (2013.01); *G11C 16/32* (2013.01); *H03K 3/017* (2013.01); *G11C 16/0483* (2013.01)

(58) Field of Classification Search
CPC ...... G06F 13/1668; G11C 16/32; H03K 3/017
USPC ....................................................... 710/308
See application file for complete search history.

(56) References Cited

U.S. PATENT DOCUMENTS 10,097,169 B1 * 10/2018 Pan ..................... H03F 3/45995
10,270,429 B1 *  4/2019 Wang ................... H04L 25/063
10,630,272 B1    4/2020 Ashtiani et al.
(Continued)

*Primary Examiner* — Chun Kuan Lee
(74) *Attorney, Agent, or Firm* — Lowenstein Sandler LLP

(57) ABSTRACT

An electrical circuit device includes a signal bus comprising a plurality of parallel signal paths and a calibration circuit, operatively coupled with the signal bus. The calibration circuit can perform operations including determining a representative duty cycle for a plurality of signals transferred via the plurality of parallel signal paths, the plurality of signals comprising a plurality of duty cycles and comparing the representative duty cycle for the plurality of signals transferred via the plurality of parallel signal paths to a reference value to determine a comparison result. The calibration circuit can perform further operations including adjusting, based on the comparison result, a trim value associated with the plurality of duty cycles of the plurality of signals to compensate for distortion in the plurality of duty cycles and calibrating the plurality of duty cycles of the plurality of signals using the adjusted trim value.

20 Claims, 6 Drawing Sheets

(56) References Cited

U.S. PATENT DOCUMENTS

| | | |
|---|---|---|
| 2004/0161068 A1 | 8/2004 | Zerbe et al. |
| 2018/0175834 A1 | 6/2018 | Modi et al. |
| 2020/0220528 A1 | 7/2020 | Koh et al. |

* cited by examiner

DATA BUS DUTY CYCLE DISTORTION COMPENSATION

RELATED APPLICATIONS

This application is a continuation of U.S. patent application Ser. No. 16/949,510, filed Oct. 30, 2020, the entire contents of which are hereby incorporated by reference herein.

TECHNICAL FIELD

Embodiments of the disclosure relate generally to memory sub-systems, and more specifically, relate to data bus duty cycle distortion compensation in an electrical circuit device, such as a memory device of a memory sub-system.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
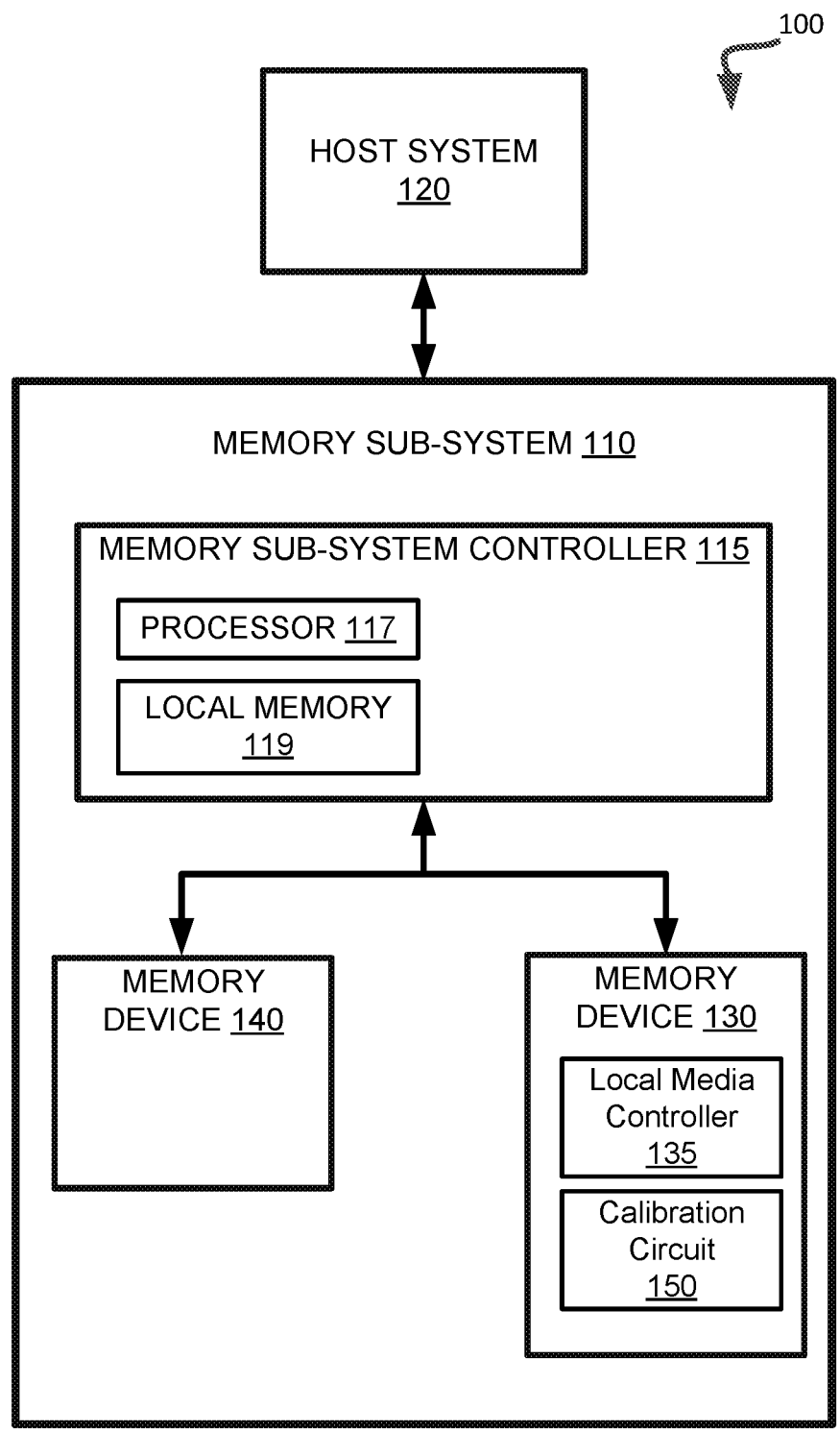
FIG. 1 illustrates an example computing system that includes a memory sub-system in accordance with some embodiments of the present disclosure.

Aspects of the present disclosure are directed to data bus duty cycle distortion compensation in an electrical circuit device, such as a memory device of a memory sub-system. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Other examples of non-volatile memory devices are described below in conjunction with FIG. 1. A non-volatile memory device is a package of one or more memory dies. Each die can consist of one or more planes. For some types of non-volatile memory devices (e.g., NAND devices), each plane consists of a set of physical blocks. Each block consists of a set of pages. Each page consists of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

A memory device can be made up of bits arranged in a two-dimensional grid or a three-dimensional grid. Memory cells are formed onto a silicon wafer in an array of columns (also hereinafter referred to as bitlines) and rows (also hereinafter referred to as wordlines). A wordline can refer to one or more rows of memory cells of a memory device that are used with one or more bitlines to generate the address of each of the memory cells. The intersection of a bitline and wordline constitutes the address of the memory cell. A block hereinafter refers to a unit of the memory device used to store data and can include a group of memory cells, a wordline group, a wordline, or individual memory cells.

Clock signals are used to coordinate actions of electrical circuits in electrical circuit devices, such as memory devices. The duty cycle of a clock signal is a ratio of the pulse time of the clock signal to its cycle period. A duty cycle of a clock signal can become distorted due to a variety of sources, including amplifiers that make up a clock tree, large propagation distances between amplifier stages of the clock tree, and/or parasitic conductor capacitance. Distortion of the duty cycle skews timing margins defined by the clock signal in electrical circuit devices. As a result, an electrical circuit using the distorted clock signal can have smaller timing windows in which to transfer and/or process data, which could lead to reduced pulse widths, data errors, and unreliable circuit performance. As input/output speeds increase (e.g., as the cycles of a clock signal are reduced), it also becomes increasingly more challenging to reduce duty cycle distortion, meaning that the consequences of duty cycle distortion at high input/output speeds are even more apparent. In addition, electrical circuits at different locations (e.g., on different electrical circuit dies or memory dies) can experience varying degrees of duty cycle distortion of a clock signal due to differing sources of distortion located along the corresponding clock branches of a clock tree that define the clock signal pathways.

In addition, many electrical circuit devices utilize multi-branch data paths including multiple parallel signal paths from a common source to a common destination. Although each parallel signal path may be formed with identical circuitry (i.e., having the same schematic and layout), processing variations introduced during the manufacturing of the components that form the parallel signal paths can lead to differences in the degrees of duty cycle distortion associated with each signal path. Accordingly, many duty cycle distortion compensation techniques, such as those that utilize a standard or default trim setting, or those that calibrate the multiple parallel signal paths based on the characteristics of only one of the signal paths, are inadequate. Any such compensation techniques, even if they were to account for systematic distortion and/or die to die variations in the electrical circuit device, still fail to compensate for and may even negatively impact the local variation between the individual parallel signal paths. As such, substantial duty cycle distortion is still present, and the duty cycle distortion attributable to local variation may even be worse than before such techniques were used, leading to increased errors in the signals transmitted via the multiple parallel signal paths. This decreases the accuracy of the electrical circuit device and can result in sub-optimal performance.

Aspects of the present disclosure address the above and other deficiencies by performing data bus duty cycle distortion compensation in an electrical circuit device. In one embodiment, the data bus (i.e., a signal bus) includes multiple parallel signal paths, each having unique characteristics that can impact an associated duty cycle of signals transferred thereon. To account for those differences, a calibration circuit determines a representative duty cycle for multiple signals transferred via the multiple parallel signal paths of the data bus. In one embodiment, a multiple inputs integrator circuit including multiple passive low pass filters receives the signals from the multiple parallel signal paths and generates a direct current level representation of the duty cycle of each signal. The representative duty cycle can include, for example, an average of the direct current level representations. In one embodiment, this representative duty cycle is compared to a reference value. Depending on whether the representative duty cycle is greater than or less than the reference value, the calibration circuit can adjust a trim value associated with the duty cycles to compensate for any distortion. The calibration circuit can further calibrate the duty cycles of the signals transferred via the multiple parallel signal paths by applying the adjusted trim value.

Advantages of this approach include, but are not limited to, improved performance in the memory sub-system or other electronic circuit device attributable at least in part to more accurate signal calibration. For example, the techniques described herein allow for compensation of systematic duty cycle distortion and/or die to die variations in the electrical circuit device, as well as the local variation between the individual parallel signal paths. Depending on the implementation, the duty cycle distortion attributable to that local variation is reduced, particularly, when the number of parallel signal paths is relatively low. Accordingly, more of the total duty cycle distortion can be compensated for, thereby reducing errors in the signals transmitted via the multiple parallel signal paths. In addition, the calibration routine described herein can be performed relatively quickly so as to reduce latency and improve signal transfer times.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130,140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can be a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc.

The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory sub-system 110 is a managed memory device, which includes a raw memory device 130 having control logic (e.g., local controller 132) on the die and a controller (e.g., memory sub-system controller 115) for media management within the same memory device package. An example of a managed memory device is a managed NAND (MNAND) device.

In one embodiment, memory sub-system 110 is one example of an electrical circuit device, as described herein, and memory device 130 is one example of an electrical circuit die. In one embodiment, memory sub-system 110 includes a clock generator (now shown) which can be disposed either within memory device 130 or elsewhere within memory sub-system 110. The clock generator produces a clock signal that is used to coordinate actions of electrical circuits within memory sub-system 110. The clock generator can transmit the clock signal to various components of the memory sub-system 110 via a clock tree. For example, the clock generator can send the clock signal to memory sub-system controller 115 via a first clock branch and to memory device 130 via a second clock branch of the clock tree. In other embodiments, memory sub-system 110 can instead rely upon an externally supplied clock signal (e.g., provided by an external host, or by a processor or controller separate from the electrical circuit device). In other embodiments, the clock signal can be partially generated and/or partially supplied externally and partially generated and/or partially supplied by circuitry located in memory sub-system 110.

In one embodiment, the clock signal and/or any other signals (e.g., data signals, command signals) can be transmitted via a signal bus either internal or external to memory device 130. The signal bus can include, for example, multiple parallel signal paths. Each of the multiple parallel signal paths can be identical in design and composition, however, the components used to form each of the multiple parallel signal paths can have processing variations introduced during manufacture. These variations can impact the duty cycles of the signals transferred via the multiple parallel signal paths. Accordingly, in one embodiment, memory device 130 includes calibration circuit 150 which can calibrate the duty cycles of those signals in a manner to account for the local variations between the multiple parallel signal paths. In one embodiment, the calibration circuit 150 can determine a representative duty cycle (e.g., an average duty cycle) for all of the signals transferred via the multiple parallel signal paths and compare the representative duty cycle to a reference value to determine a comparison result. Based on the comparison result, the calibration circuit can adjust a trim value associated with the duty cycles of the signals to compensate for distortion in the duty cycles and can calibrate all of the duty cycles using the adjusted trim value. Furthermore, in embodiments that include multiple electrical circuit dies (e.g., memory devices), calibration circuit 150 be used on all or a subset of the electrical circuit dies. In these and other embodiments, calibration circuit 150 can be used in addition to or in lieu of other calibration circuitry (e.g., a DLL calibration circuitry) and/or of other techniques (e.g., a general, static trim value for all electrical circuit dies). Moreover, as described herein, calibration circuit 150 consumes a relatively smaller amount of area and a relatively lesser amount of power than other circuitry (e.g., DLL calibration circuitry) used for calibration. Calibration circuit 150 also does not require a warm-up cycle and is able to begin calibration during the first iteration of the clock signal. In addition, calibration circuit 150 can utilize stable trim (e.g., digital trim) and biasing (e.g., voltage and/or current) values specific to each individual electrical circuit die, accounting for die-to-die variations in exhibited duty cycle distortion of the clock signal. Further details with regards to the operations of calibration circuit 150 are described below.

Figure 2:
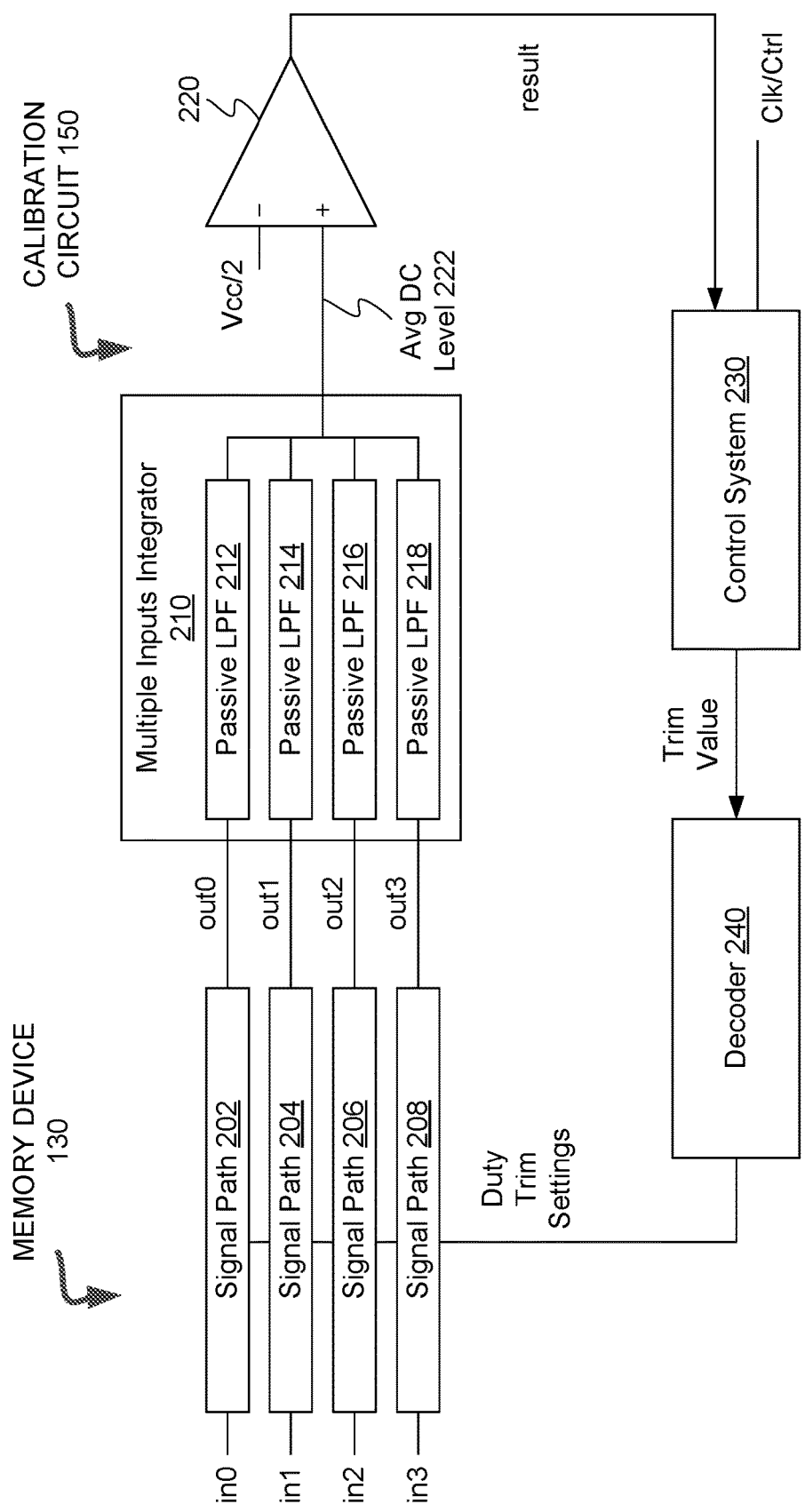
FIG. 2 is a block diagram illustrating a portion of a memory device having duty cycle distortion calibration circuitry in accordance with some embodiments of the present disclosure.

FIG. 2 is a block diagram illustrating a portion of a memory device 130 having duty cycle distortion calibration circuitry in accordance with some embodiments of the present disclosure. As illustrated, the portion of memory device 130 can include a multi-branch data path including multiple parallel signal paths, such as signal paths 202, 204, 206, and 208 used to transmit signals from a common source to a common destination. For ease of description each of signal paths 202, 204, 206, and 208 can have a corresponding input (i.e., in0, in1, in2, in3) and a corresponding output (i.e., out0, out1, out2, out3). In one embodiment, the signals transmitted via signal paths 202, 204, 206, and 208 can already include duty cycle distortion from sources external to the memory device 130 (e.g., due to board design and/or other sources of the memory sub-system 110). Signals paths 202, 204, 206, and 208 can be used to transmit signals to any number of destinations within memory device 130, including for example, to a memory array, such as a NAND memory array, or to some other integrated circuitry. Depending on the embodiment, duty cycle distortion can be added to the signals from sources along the internal signal pathway and can accumulate with distortion already introduced by sources encountered along the signal pathway located external to the memory device 130. Since the calibration circuit 150 samples the signals at the outputs of signal paths 202, 204, 206, and 208 (i.e., at outputs out0, out1, out2, out3), both sources of duty cycle distortion can be detected and accounted for during the calibration. In other embodiments, memory device 130 can include multiple duty cycle distortion calibration circuits 150 and can sample and calibrate the signals at all or a subset of the points along the internal signal pathway described herein.

In one embodiment, the calibration circuit 150 includes multiple inputs integrator 210, a comparator 220, a control system 230, and a decoder 240. Depending on the embodiment, control system 230 and decoder 240 can be part of local media controller 135, as shown in FIG. 1. In other embodiments, the calibration circuit 150 can include any combination of these or other components and/or can omit some or all of these components.

In one embodiment, calibration circuit 150 samples the signals from the multiple parallel signal paths 202, 204, 206, and 208 to calibrate the duty cycle of each signal. More specifically, multiple inputs integrator 210 receives the signals at the outputs (i.e., out0, out1, out2, out3) of the signal paths 202, 204, 206, and 208. In one embodiment, multiple inputs integrator 210 includes respective passive low pass filters (LPFs) 212, 214, 216, and 218, each corresponding to one of the multiple parallel signal paths 202, 204, 206, and 208. The passive low pass filters 212, 214, 216, and 218 convert the voltage signals to corresponding direct current (DC) level (e.g., analog level) representations of the duty cycles of the voltage signals from signal paths 202, 204, 206, and 208. The outputs of each of passive low pass filters 212, 214, 216, and 218 are combined together to represent an average DC level representation 222 (i.e., [DC(out0)+DC(out1)+DC(out2)+DC(out3)]/n (where n represents the number of signal paths/passive LPFs). The comparator 220 converts the average DC level representation 222 into a digital signal representation, and compares the digital signal representation to a reference value. In one embodiment, the reference value is one half of a voltage supply level (i.e., Vcc/2), which corresponds to a duty cycle of 50. The comparator 220 provides one or more results of the comparison (i.e., whether the average DC level representation 222 is greater than or less than the reference value) to control system 230. The control system 230, which can be a state machine, for example, performs an algorithm (e.g., a bisectional sweep algorithm and/or a binary search) to calculate and/or adjust (e.g., using a lookup table) one or more trim values (e.g., digital trim values), which are used to decrease the duty cycle of the voltage signal with the larger duty cycle and to increase the duty cycle of the voltage signal with the smaller duty cycle. The one or more trim values are passed to decoder 240 (e.g., a digital-to-analog converter), which converts the one or more trim values into duty trim settings (e.g., a biasing voltage and/or biasing current) that are fed into the voltage signals in the multiple parallel signal paths 202, 204, 206, and 208. In one embodiment, the same duty trim settings, which are based on the average DC level representation 222, are applied to each of the multiple parallel signal paths 202, 204, 206, and 208.

Figure 3:
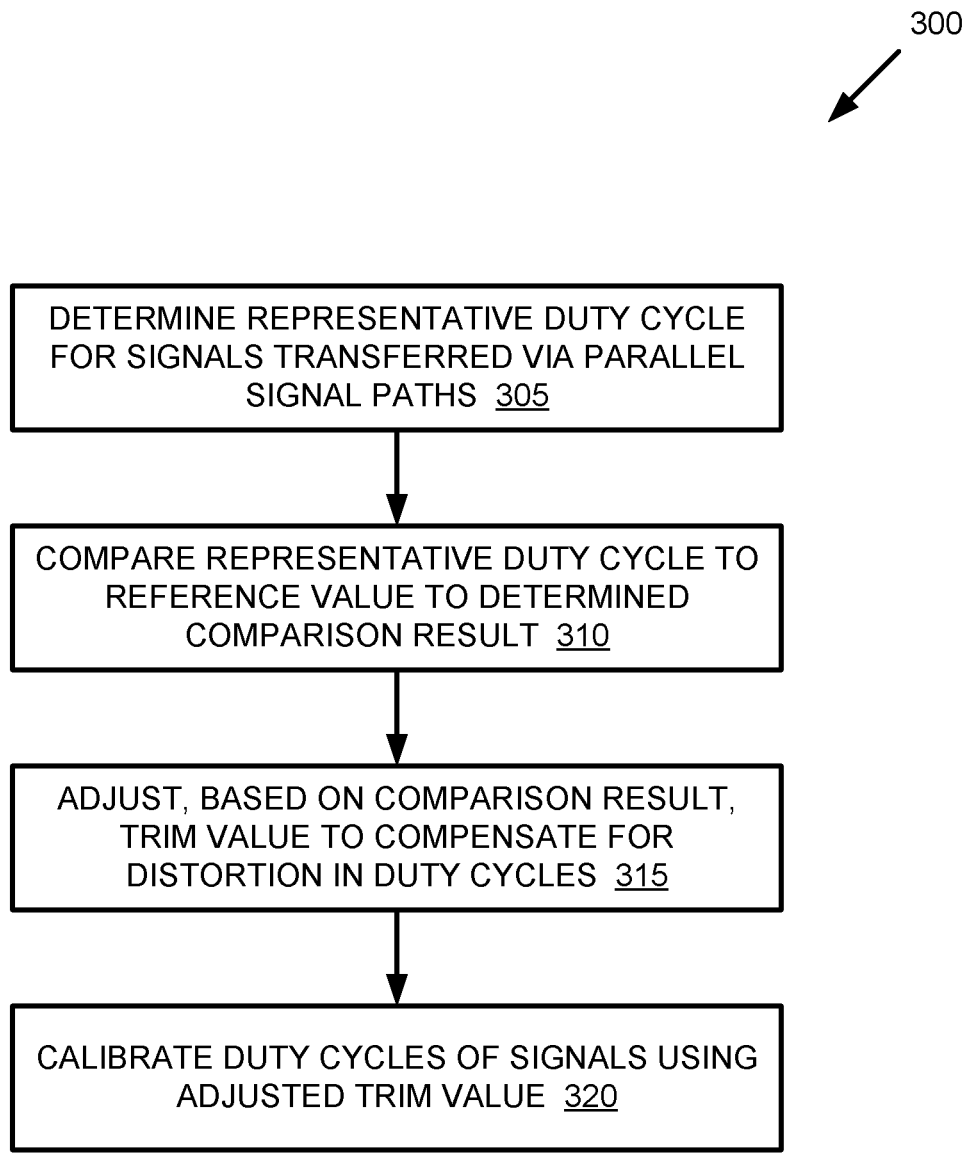
FIG. 3 is a flow diagram of an example method of data bus duty cycle distortion compensation in an electrical circuit device in accordance with some embodiments of the present disclosure.

FIG. 3 is a flow diagram of an example method of data bus duty cycle distortion compensation in an electrical circuit device in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by calibration component 150 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 305, a representative value is determined. For example, the processing logic (e.g., local media controller 135 in connection with calibration component 150) of a memory device, such as memory device 130, determines the representative value, such as a representative duty cycle for signals transferred via multiple parallel signal paths, such as parallel signal paths 202, 204, 206, and 208. In one embodiment, calibration component 150 obtains direct current (DC) level (e.g., analog level) representations of the duty cycles of the transferred voltages signals. For example, calibration component 150 can pass the voltage signals through respective low pass filters, such as passive low pass filters 212, 214, 216, and 218 to obtain the DC level representations of the duty cycles of the voltage signals. In one embodiment, the outputs of each of the respective low pass filters are combined together to generate a DC level representation, such as an average DC level representation.

At operation 310, a comparison is performed. For example, the processing logic can convert the DC level representation of the duty cycles into a digital signal representation and compare the digital signal representation to a reference value. In one embodiment, calibration component 150 can pass the DC level representation of the duty cycle to a comparator (e.g., comparator 220) that is able to handle very small voltage offsets (e.g., an auto-zeroing comparator) to convert the DC level representation into a digital signal representation and to compare the digital signal representation to a reference value. In one embodiment, the reference value is one half of a voltage supply level (i.e., Vcc/2). The comparator can then pass a comparison result to a control system (e.g., control system 230) indicating whether the average DC level 222 is larger or smaller than the reference value. In some embodiments, the result can include a digital signal representation of the magnitude of the difference between average DC level 222 and the reference value.

At operation 315, a trim value is adjusted. For example, the processing logic can calculate and/or adjust one or more digital trim values of the electrical circuit die, such as memory device 130, and store the digital trim value(s). In some embodiments, the digital trim value(s) can commonly correspond to the voltage signals transmitted via the multiple parallel signal lines. For example, the control system (e.g., control system 230) of the calibration circuit 150 can perform a bisectional sweep algorithm and/or a binary search (e.g., over multiple iterations) to calculate and/or adjust the digital trim value(s) and store the digital trim value(s) (e.g., on the state machine, a controller of the electrical circuit device, a controller of the electrical circuit die, and/or a host device). In embodiments where the state machine stores the digital trim value(s) at a location other than at the state machine, the digital trim value(s) can be provided to the state machine (e.g., when the calibration circuitry is activated). In these and other embodiments, the digital trim value(s) can be passed to the state machine to validate the digital trim value(s) and/or to validate digital trim value(s) stored on the state machine.

The newly calculated and/or adjusted digital trim value(s) can be used to make the duty cycle of the voltage signals smaller or larger. In embodiments where the result from the comparator includes an indication of the magnitude of the difference between the representative duty cycle and the reference value, the state machine (i.e., control system 230) can calculate and/or adjust the trim value(s) (e.g., using a lookup table, a bisectional sweep algorithm, and/or a binary search) to adjust the trim values based on the difference. In these and other embodiments, the trim value(s) can also be calculated and/or adjusted according to results of previous iterations of the calibration circuitry. For example, the circuit 150 in a first iteration calibrating the voltage signals can adjust the duty cycles by a certain amount (e.g., 12.5%). On the next iteration, the calibration circuit 150 can note (e.g., from the result sent to the state machine from the comparator) that the difference between the representative duty cycle of the voltage signals and the reference value in the second iteration is smaller or larger in comparison to the difference in the first iteration and can, accordingly, calculate and/or adjust the digital trim value(s) to adjust the duty cycles of the voltage signals by a lesser, greater, and/or equivalent amount (e.g., a percentage lesser, greater, and/or equivalent to 12.5%) than the adjustment made in the first iteration.

At operation 320, duty cycles are calibrated. For example, the processing logic can convert the digital trim value(s) into one or more biasing voltages and/or biasing currents that can be used to calibrate the duty cycles of the voltage signals transmitted via the multiple parallel signal paths to account for duty cycle distortion. For example, control system 230 can pass the digital trim value(s) to biasing circuitry (e.g., decoder 240), which can convert the digital trim value(s) into one or more biasing voltages and/or biasing currents. The biasing circuitry can apply the one or more biasing voltages and/or biasing currents to the multiple parallel signal paths 202, 204, 206, and 208 (e.g., directly after the inputs in0, in1, in2, and in3, or shortly thereafter). In another embodiment, the digital trim value(s) can be directly used to enable/disable one or more legs of a pull-up/pull-down network of digital gates to adjust the duty cycles of the voltage signals, without utilizing decoder 240 or other biasing circuitry. In some embodiments, the processing can automatically return to operation 305 to perform the next iteration of distortion calibration. In other embodiments, the processing can wait to return to operation 305 until directed to return (e.g., by the controller of the electrical circuit device; a controller internal to the electrical circuit die; and/or the host system). In this manner, the processing is able to calibrate (e.g., over a single and/or multiple iterations) the duty cycles of the signals transmitted via multiple parallel signal paths by calculating one or more optimized digital trim values to account for distortion introduced by external and/or internal distortion sources.

Figure 4:
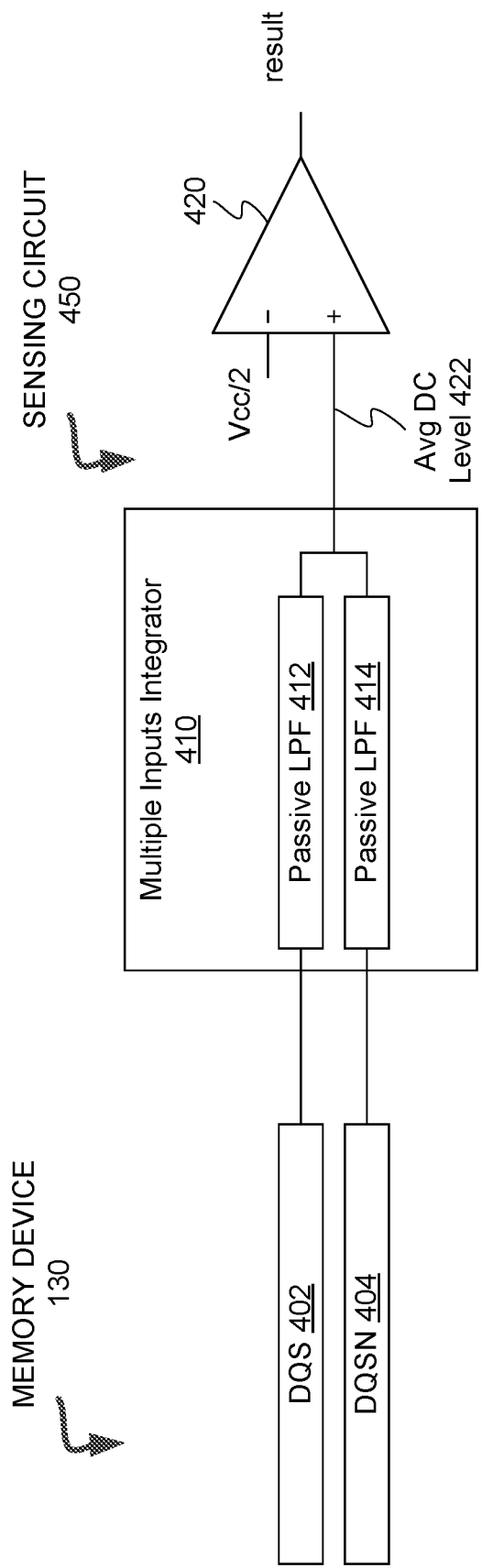
FIG. 4 is a block diagram illustrating a portion of a memory device having a pad_io distortion sensor in accordance with some embodiments of the present disclosure.

FIG. 4 is a block diagram illustrating a portion of a memory device having a pad_io distortion sensor in accordance with some embodiments of the present disclosure. Certain electronic circuit devices, such as memory device 130, can utilize differential data strobe signals, such as DQS 402 and DQSN 404. In one embodiment, DQS 402 and DQSN 404 are complementary data strobe signals that can provide a synchronous reference for data input and output in the memory device 130, such as data received or transmitted at I/O pins of the device. Although reference may be made to I/O pins, they may include any conductive node providing for electrical connection to the memory device 130 by an external device, such as conductive pads or conductive bumps as are commonly used. Since the differential data strobe signals DQS 402 and DQSN 404 are transferred via separate signal pathways in memory device 130, each signal can experience different levels of distortion. For example, each signal can commonly experience distortion attributable to a read clock signal RDCLK in the memory device 130 (i.e., RDCLK distortion), but can separately experience distortion associated with a corresponding I/O pin (i.e., pad_io distortion). Since the differential data strobe signals DQS 402 and DQSN 404 are complementary, in one case the RDCLK distortion and the pad_io distortion will be additive, and in other case, the RDCLK distortion and the pad_io distortion can possible cancel each other out to some extent. When the data pattern of one pad_io pair (i.e., a group of two data or data strobe signals) is the same as a differential clock, the RDCLK distortion will add to the distortion of one signal from the pad_io pair, but subtract from the other. For example, if the RDCLK distortion is A, and the pad_io distortion is B (where A and B are not absolute values, but can be either positive or negative), the total distortion would be B+A for one pad_io and B-A for the other. So the average of B+A and B-A is just B. Accordingly, in one embodiment, to more accurately sense the levels of pad_io distortion without utilizing separate sensing and calibration circuitry for each signal pathway, sensing circuit 450 can be utilized. In one embodiment, the sensing circuit 450 includes multiple inputs integrator 410 and a comparator 420. In other embodiments, the sensing circuit 450 can include any combination of these or other components and/or can omit some or all of these components.

In one embodiment, sensing circuit 450 samples the signals DQS 402 and DQSN 404 to determine the duty cycle of each signal. In one embodiment, multiple inputs integrator 410 includes respective passive low pass filters (LPFs) 412 and 414, each corresponding to one of the signal paths. The passive low pass filters 412 and 414 convert the voltage signals to corresponding direct current (DC) level (e.g., analog level) representations of the duty cycles of the voltage signals. The outputs of each of passive low pass filters 412 and 414 are combined together to represent an average DC level representation 422 (i.e., [DC(DQS)+DC(DQSN)]/2). The comparator 420 converts the average DC level representation 422 into a digital signal representation, and compares the digital signal representation to a reference value. In one embodiment, the reference value is one half of a voltage supply level (i.e., Vcc/2), which corresponds to a duty cycle of 50. The comparator 420 generates one or more results of the comparison (i.e., whether the average DC level representation 422 is greater than or less than the reference value). Thus, the polarity of the result indicates if the pad_io distortion for the data strobe signals DQS 402 and DQSN 404 is larger or smaller than zero.

Figure 5:
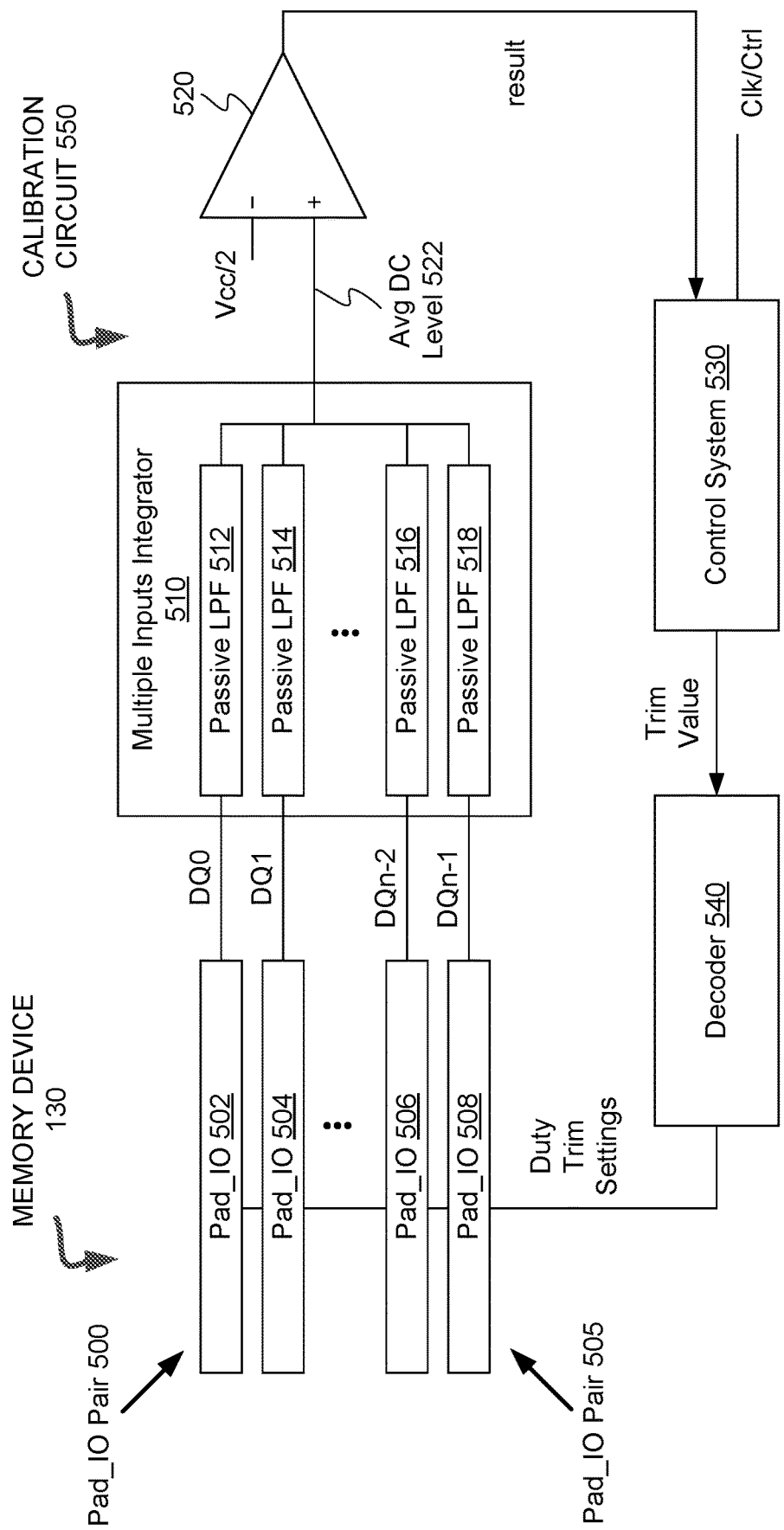
FIG. 5 is a block diagram illustrating a portion of a memory device having pad_io distortion calibration circuitry in accordance with some embodiments of the present disclosure.

FIG. 5 is a block diagram illustrating a portion of a memory device having pad_io distortion calibration circuitry in accordance with some embodiments of the present disclosure. In one embodiment, the differential data strobe signals, such as DQS 402 and DQSN 404, as well as a set of data signals (e.g., DQ0-DQn-1) are all associated with the read clock signal RDCLK in the memory device 130. Since each signal is associated with the common RDCLK signal, calibrating the total distortion can be complicated. Accordingly in one embodiment, the differential data strobe signals DQS 402 and DQSN 404 form one pad_io pair, and the remaining data signals DQ0-DQn-1 are arranged in additional pad_io pairs. For example, pad_io pair 500 can include pad_io 502 and pad_io 504, corresponding to data signals DQ0 and DQ1 respectively, and pad_io pair 505 can include pad_io 506 and pad_io 508, corresponding to data signals DQn-2 and DQn-1 respectively. In one embodiment, there are additional pad_io pairs which are not illustrated in FIG. 5. For each pad_io pair, such as pad_io pair 500 and pad_io pair 505, one DQ signal has the same data pattern as the data strong signal DQS and the other DQ signal has the same data pattern as DQSN. Accordingly, in one embodiment, to more accurately sense the levels of pad_io distortion without utilizing separate sensing and calibration circuitry for each signal pathway, calibration circuit 550 can be utilized. In one embodiment, the calibration circuit 550 includes multiple inputs integrator 510, a comparator 520, a control system 530, and a decoder 540. Depending on the embodiment, control system 530 and decoder 540 can be part of local media controller 135, as shown in FIG. 1. In other embodiments, the calibration circuit 550 can include any combination of these or other components and/or can omit some or all of these components.

In one embodiment, calibration circuit 550 samples the signals from each pad_io pair to calibrate the duty cycle of each signal. More specifically, multiple inputs integrator 510 receives the signals at the outputs of each pad_io. In one embodiment, multiple inputs integrator 510 includes respective passive low pass filters (LPFs) 512, 514, 516, and 518, each corresponding to one the pad_ios. The passive low pass filters 512, 514, 516, and 518 convert the voltage signals to corresponding direct current (DC) level (e.g., analog level) representations of the duty cycles of the voltage signals from the pad_ios. The outputs of each of passive low pass filters 512, 514, 516, and 518 are combined together to represent an average DC level representation 522 (i.e., [DC(DQS)+DC(DQSN)+DC(DQ0)+DC(DQ1) . . . +DC(DQn-1)]/n+2 (where n represents the number of data signals DQ). The comparator 520 converts the average DC level representation 522 into a digital signal representation, and compares the digital signal representation to a reference value. In one embodiment, the reference value is one half of a voltage supply level (i.e., Vcc/2), which corresponds to a duty cycle of 50. The comparator 520 provides one or more results of the comparison (i.e., whether the average DC level representation 522 is greater than or less than the reference value) to control system 530. The control system 530, which can be a state machine, for example, performs an algorithm (e.g., a bisectional sweep algorithm and/or a binary search) to calculate and/or adjust (e.g., using a lookup table) one or more trim values (e.g., digital trim values), which are used to decrease the duty cycle of the voltage signal with the larger duty cycle and to increase the duty cycle of the voltage signal with the smaller duty cycle. The one or more trim values are passed to decoder 540 (e.g., a digital-to-analog converter), which converts the one or more trim values into duty trim settings (e.g., a biasing voltage and/or biasing current) that are fed into the voltage signals in the pad_ios. In one embodiment, the same duty trim settings, which are based on the average DC level representation 522, are applied to each of the pad_ios.

Figure 6:
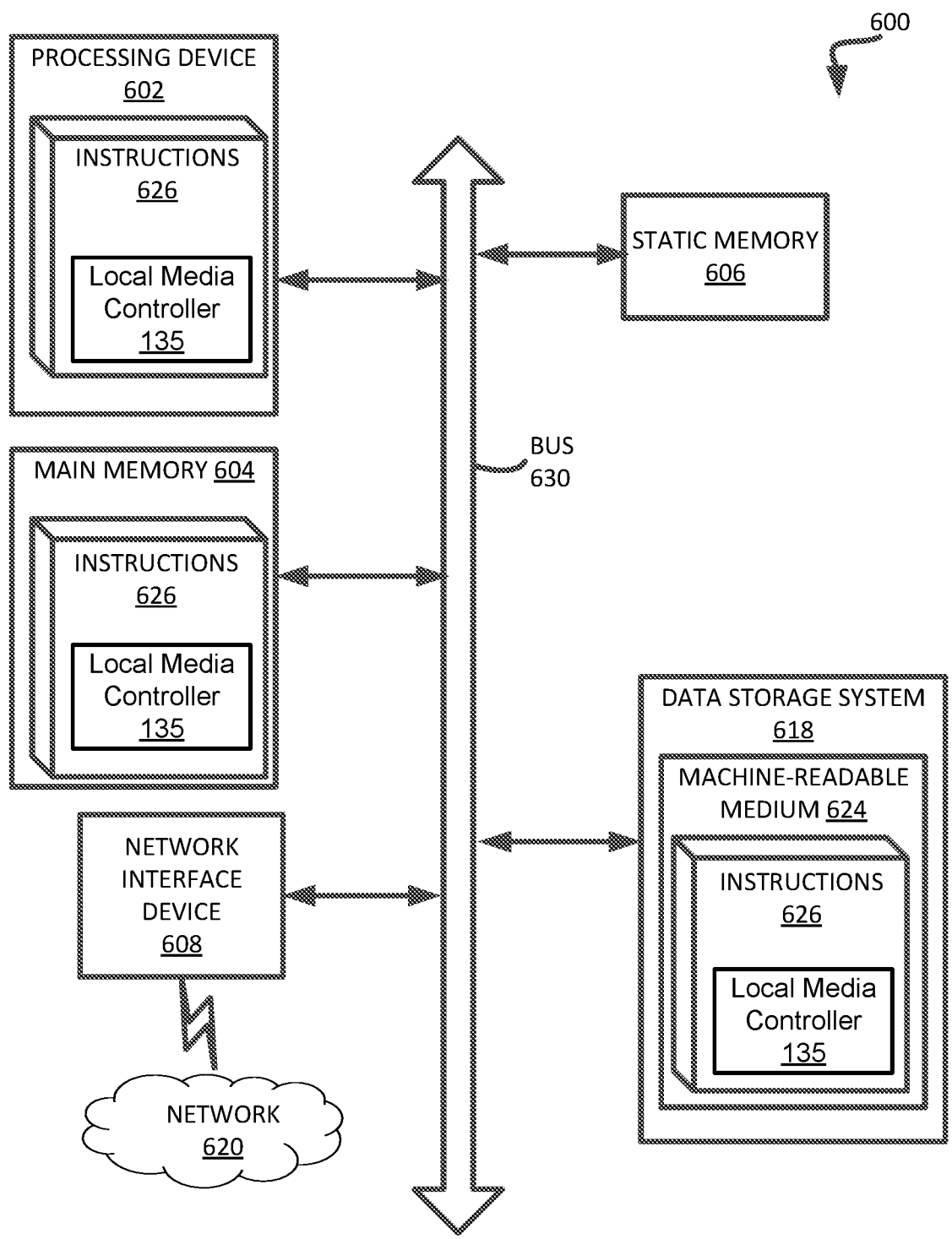
FIG. 6 is a block diagram of an example computer system in which embodiments of the present disclosure can operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to local media controller 135 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium, such a non-transitory computer-readable medium) on which is stored one or more sets of instructions 626 or software embodying any one or more of the methodologies or functions described herein. In one embodiment, this medium 624 is also writable by local media controller 135, memory sub-system controller 115, or other components. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to local media controller 135 of FIG. 1. While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. An electrical circuit device comprising:
a signal bus comprising a plurality of parallel signal paths; and
a calibration circuit, operatively coupled with the signal bus, the calibration circuit comprising:
a first circuit coupled to the plurality of parallel signal paths, the first circuit to determine a representative duty cycle for a plurality of duty cycles of a plurality of signals transferred via the plurality of parallel signal paths, and to determine whether the representative duty cycle is greater than or less than a reference value; and
a second circuit coupled to first circuit, the second circuit to calibrate the plurality of duty cycles of the plurality of signals based on whether the representative duty cycle is greater than or less than the reference value.

2. The electrical circuit device of claim 1, wherein the first circuit comprises a multiple inputs integrator circuit comprising a plurality of passive low pass filters coupled to the plurality of parallel signal paths, the plurality of passive low pass filters to obtain a plurality of direct current (DC) level representations of the plurality of duty cycles of the plurality of signals, and wherein an output of the multiple inputs integrator circuit comprises a DC level representation for the plurality of DC level representations.

3. The electrical circuit device of claim 2, wherein the first circuit further comprises a comparator circuit to convert the DC level representation into a representative digital signal representation, and to determine whether the representative duty cycle is greater than or less than a reference value, the comparator circuit is to compare the DC level representation to the reference value.

4. The electrical circuit device of claim 1, wherein the representative duty cycle for the plurality of duty cycles of the plurality of signals transferred via the plurality of parallel signal paths comprises an average of the plurality of duty cycles, and wherein the reference value comprises one half of a voltage supply level.

5. The electrical circuit device of claim 1, wherein the second circuit comprises a decoder circuit to convert a trim value associated with the plurality of duty cycles of the plurality of signals into one or more biasing voltages and/or biasing currents and apply the one or more biasing voltages and/or biasing currents to the plurality of signals transferred via the plurality of parallel signal paths to calibrate the plurality of duty cycles.

6. The electrical circuit device of claim 1, further comprising:
a memory array, wherein the signal bus comprising the plurality of parallel signal paths is coupled to the memory array.

7. The electrical circuit device of claim 1, wherein distortion in the plurality of duty cycles is based at least in part on processing variations in components that form the plurality of parallel signal paths.

8. An electrical circuit device comprising:
a signal bus comprising a plurality of parallel signal paths; and
a calibration circuit, operatively coupled with the signal bus, to perform operations comprising:
determining representative duty cycle for a plurality of duty cycles of a plurality of signals transferred via the plurality of parallel signal paths;
determining whether the representative duty cycle is greater than or less than a reference value; and
calibrating the plurality of duty cycles of the plurality of signals based on whether the representative duty cycle is greater than or less than the reference value.

9. The electrical circuit device of claim 8, wherein the calibration circuit is to perform operations further comprising:
obtaining, using a plurality of passive low pass filters, a plurality of direct current (DC) level representations of the plurality of duty cycles of the plurality of signals;
determining a DC level representation for the plurality of DC level representations; and
converting, using a comparator, the DC level representation into a representative digital signal representation.

10. The electrical circuit device of claim 9, wherein determining whether the representative duty cycle is greater than or less than the reference value comprises comparing, using the comparator, the DC level representation to the reference value.

11. The electrical circuit device of claim 8, wherein the representative duty cycle for the plurality of duty cycles of the plurality of signals transferred via the plurality of parallel signal paths comprises an average of the plurality of duty cycles, and wherein the reference value comprises one half of a voltage supply level.

12. The electrical circuit device of claim 8, wherein the calibration circuit is to perform operations further comprising:
converting a trim value associated with the plurality of duty cycles of the plurality of signals into one or more biasing voltages and/or biasing currents; and
calibrating the plurality of duty cycles by applying the one or more biasing voltages and/or biasing currents to the plurality of signals transferred via the plurality of parallel signal paths.

13. The electrical circuit device of claim 8, further comprising:
a memory array, wherein the signal bus comprising the plurality of parallel signal paths is coupled to the memory array.

14. The electrical circuit device of claim 8, wherein distortion in the plurality of duty cycles is based at least in part on processing variations in components that form the plurality of parallel signal paths.

15. A method comprising:
determining representative duty cycle for a plurality of duty cycles of a plurality of signals transferred via a plurality of parallel signal paths;

determining whether the representative duty cycle is greater than or less than a reference value; and calibrating the plurality of duty cycles of the plurality of signals based on whether the representative duty cycle is greater than or less than the reference value.

16. The method of claim 15, further comprising:

obtaining, using a plurality of passive low pass filters, a plurality of direct current (DC) level representations of the plurality of duty cycles of the plurality of signals;

determining a DC level representation for the plurality of DC level representations; and converting, using a comparator, the DC level representation into a representative digital signal representation.

17. The method of claim 16, wherein determining whether the representative duty cycle is greater than or less than the reference value comprises comparing, using the comparator, the DC level representation to the reference value.

18. The method of claim 15, wherein the representative duty cycle for the plurality of duty cycles of the plurality of signals transferred via the plurality of parallel signal paths comprises an average of the plurality of duty cycles, and wherein the reference value comprises one half of a voltage supply level.

19. The method of claim 15, further comprising:

converting a trim value associated with the plurality of duty cycles of the plurality of signals into one or more biasing voltages and/or biasing currents; and calibrating the plurality of duty cycles by applying the one or more biasing voltages and/or biasing currents to the plurality of signals transferred via the plurality of parallel signal paths.

20. The method of claim 15, wherein distortion in the plurality of duty cycles is based at least in part on processing variations in components that form the plurality of parallel signal paths.

* * * * *